United States Patent [19]

Reimer

[11] 4,223,306
[45] Sep. 16, 1980

[54] DEVICE FOR DETECTION OF SHORT CIRCUITS IN INDUSTRIAL USES

[75] Inventor: Richard A. Reimer, Tacoma, Wash.

[73] Assignee: Atlas Foundry & Machine Co., Tacoma, Wash.

[21] Appl. No.: 927,298

[22] Filed: Jul. 24, 1978

Related U.S. Application Data

[63] Continuation of Ser. No. 745,300, Nov. 26, 1976, abandoned.

[51] Int. Cl.² .............................................. G08B 21/00
[52] U.S. Cl. .................................... 340/650; 340/514; 340/644; 200/144 B
[58] Field of Search ............... 340/593, 604, 635, 644, 340/663, 650; 361/23, 29, 33; 200/144 B; 324/33

[56] References Cited

U.S. PATENT DOCUMENTS

| | | | |
|---|---|---|---|
| 1,343,196 | 6/1920 | Conway | 340/663 X |
| 1,790,771 | 2/1931 | Shackleton | 340/644 |
| 3,222,720 | 12/1965 | Saslawsky et al. | 340/593 X |
| 3,579,217 | 5/1971 | Casey et al. | 340/635 |

FOREIGN PATENT DOCUMENTS 222939  7/1959  Australia ................................. 340/604

*Primary Examiner*—John W. Caldwell, Sr.
*Assistant Examiner*—Daniel Myer
*Attorney, Agent, or Firm*—Kenneth S. Kessler; Roy E. Mattern, Jr.

[57] ABSTRACT

A method and apparatus for detecting a short circuit across a Vacuum Control Switch by electrically connecting the apparatus to that side of the Vacuum Control Switch which should be dead at anytime the Vacuum Control Switch has manually been placed in the off configuration, and utilizing the arcing and shorting voltage felt there in the event of a malfunction to produce a signal to actuate visual and audio alarm circuits. More particularly, the invention is intended for use with Vacuum Control Switches placed in very high voltage circuits such as industrial furnaces. Its primary purpose is to prevent personal injury by warning maintenance personnel of a malfunction which could produce lethal voltage on components that would be expected to be without electrical voltage whenever the Vacuum Control Switch is in the off position. The apparatus is not independently powered for detection, but utilizes that voltage which is felt on the off side of the open Vacuum Control Switch by virtue of the malfunction. The alarm circuits are physically separated from the industrial use and locked so that the alarm will continue to warn until a knowledgeable party physically shuts the warning system off.

1 Claim, 4 Drawing Figures

DEVICE FOR DETECTION OF SHORT CIRCUITS IN INDUSTRIAL USES

This is a continuation, of abandoned application Serial No. 745,300, filed 11/26/76.

BACKGROUND OF THE INVENTION

This invention is best suited for the detecting of short circuits occurring across the Vacuum Switch.

In industrial situations, vacuum switches are used to bring high voltage electrical power from main supply lines to their industrial use. The switches can be placed in their open position in order to work on equipment and prevent electrical power to reach the industrial use being worked on. However, if a short circuit should occur across the vacuum switch when the industrial use is being worked on, dangerous and lethal voltage may surge across the switch towards the industrial use. Without an adequate warning system, a repariman may suffer serious injuries.

This invention provides an audio-visual detection of short circuits across vacuum switches or similar devices, and prevents maintenance personnel from inadvertently or unknowingly disengaging the alarm by placing the alarm control panel in a remote place.

Certain prior patents have approached the solution of this problem by monitoring the vacuum switch itself to detect malfunction. U.S. Pat. Nos. 3,594,754 of Roy E. Voshell and 3,403,297 of Donald W. Couch describe methods whereby the pressure in the vacuum type circuit interrupter is measured. U.S. Pat. No. 1,733,904 by Prince is basically a redesign of the vacuum switch itself by incorporating a vacuum gauge or device which would impair the operation of the switch should the vacuum be reduced. U.S. Pat. No. 3,735,201 by May is an arcing time relay which is designed to be used with vacuum circuit breakers, and the primary purpose is detection of the loss of vacuum as manifested by an increase of arcing time. The detection device of this invention is a highly sensitive relay. These patents detect malfunction in the vacuum switch, but do not detect mechanical malfunction such as fused points or other malfunctions which can occur between the vacuum switch and the industrial use. In addition, the detection devices of the vacuum switches are complex and do not utilize the simple principle of using the malfunction voltage itself to excite alarm circuits.

U.S. Pat. No. 3,558,984 by Smith and Gray describes an A. C. System Fault Indicator which utilizes coils as sensing devices and is devised to detect various faults in phase or current in a conductor such as a distribution line. U.S. Pat. No. 3,851,322 by Compoly and Temple detects short circuits in static converters by monitoring line voltages in currents. Both these patents differ from the present invention in at least one aspect in that the present invention monitors an inert circuit.

The above inventions monitor possible malfunctions but in doing so have to use complex monitoring devices. Those detection devices which monitor the vacuum switch only, do not prevent a mechanical malfunction which can occur between the vacuum switch and the industrial use. The present invention uses the voltage of the malfunction itself to excite the warning system.

SUMMARY OF THE INVENTION

The present invention detects malfunctions in a vacuum switch caused by both fusing of points or arcing due to pressure loss and also detects possible mechnical malfunction. The invention does not depend upon the proper functioning of indirect sensing devices, but directly utilizes the malfunction voltage to excite alarm circuits. Because it monitors a normally inert circuit no elaborate discrimination or measurement device need be employed. Voltage of any magnitude can be utilized to trigger the incorporated alarm devices. The controls of disengaging the alarm circuitry are physically separated and locked so that inexperienced personnel will be unable to inadvertently or unknowingly disengage the protective device.

A Vacuum Control Switch controls the high voltage electrical supply to the electrical equipment used. When the vacuum switch is manually placed in the open position thereby preventing the flow of electrical energy, certain contacts are closed connecting the line running from the off side of the vacuum switch to a metering circuit which actuates the warning circuit in the event of a malfunction.

If a short circuit or arcing is felt across the Vacuum Control Switch, when it has manually been placed in the off position, voltage will be directed to a voltage detector relay which determines whether the voltage has reached a pre-selected minimum. If it has, the voltage detector relay causes switches to close, allowing common voltage to activate the alarm circuits.

DETAILED DESCRIPTION

Figure 1:
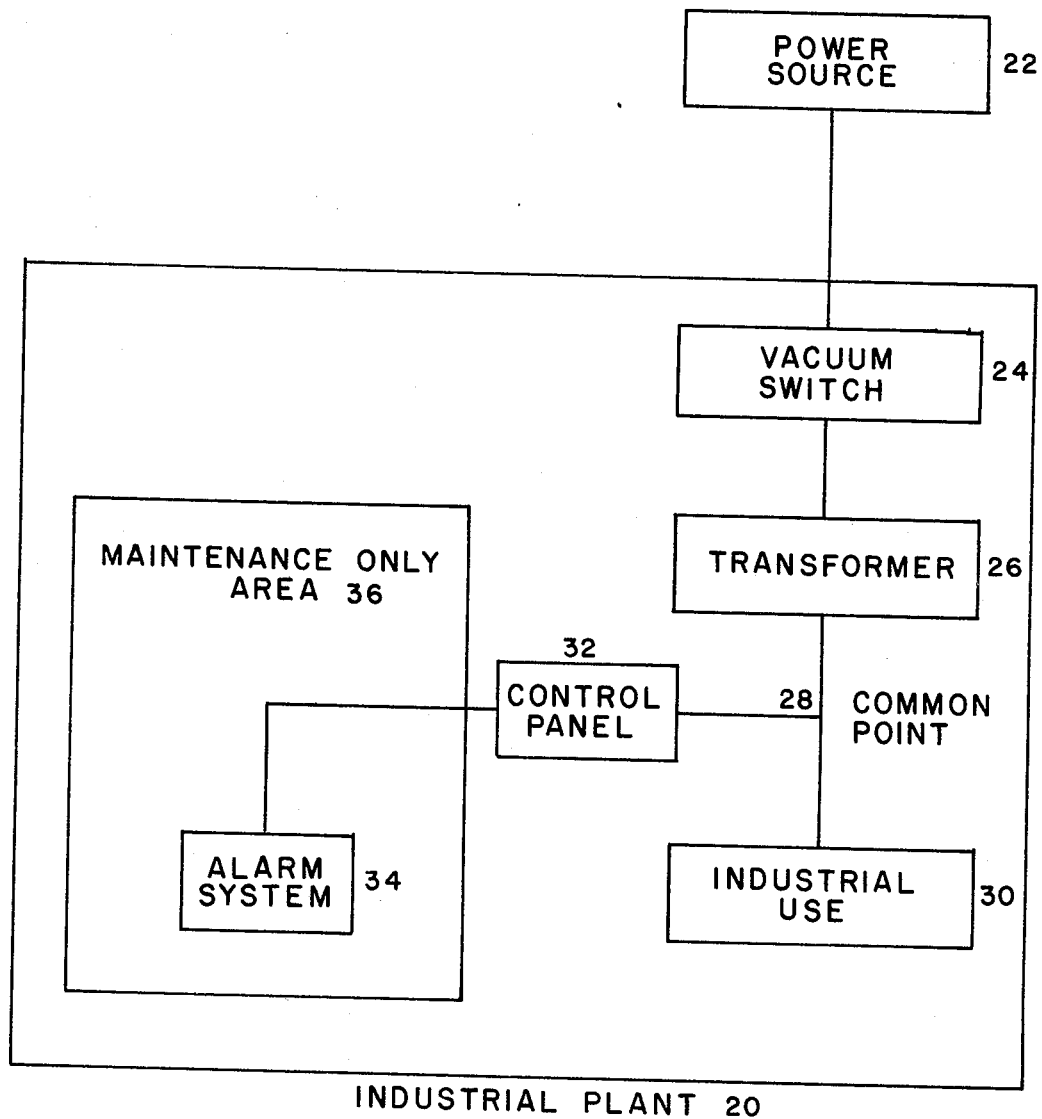
FIG. 1 is a schematic of the layout of an industrial plant showing the physical separation of the alarm system from the industrial use.

In an industrial plant 20 an alarm system 34 uses actual malfuntion voltage passing past the vacuum switch 24 towards the industrial use 30 to excite an alarm system 34.

A common point 28 is positioned between the transformer 26 and the industrial use 30. Therefore, when the industrial use 20 is shut down and no current is to flow between the transformer 26 and the industrial use 30, if a malfunction does occur, current will flow through the common point 28 towards the alarm system 34.

In FIG. 1 the physical separation of the alarm system 34 from the industrial use 30 is shown schematically.

FIG. 1 is a schematic diagram showing the physical separation of the alarm system 34 from the industrial use 30. In an industrial plant 20 a power source 22 delivers electrical energy to the industrial use 30 through a common point 28. Physically separated is a control panel 32 and an alarm system 34 placed in a maintenance only area 36, thereby preventing unauthorized personnel from turning off the alarm system 34.

Figure 2:
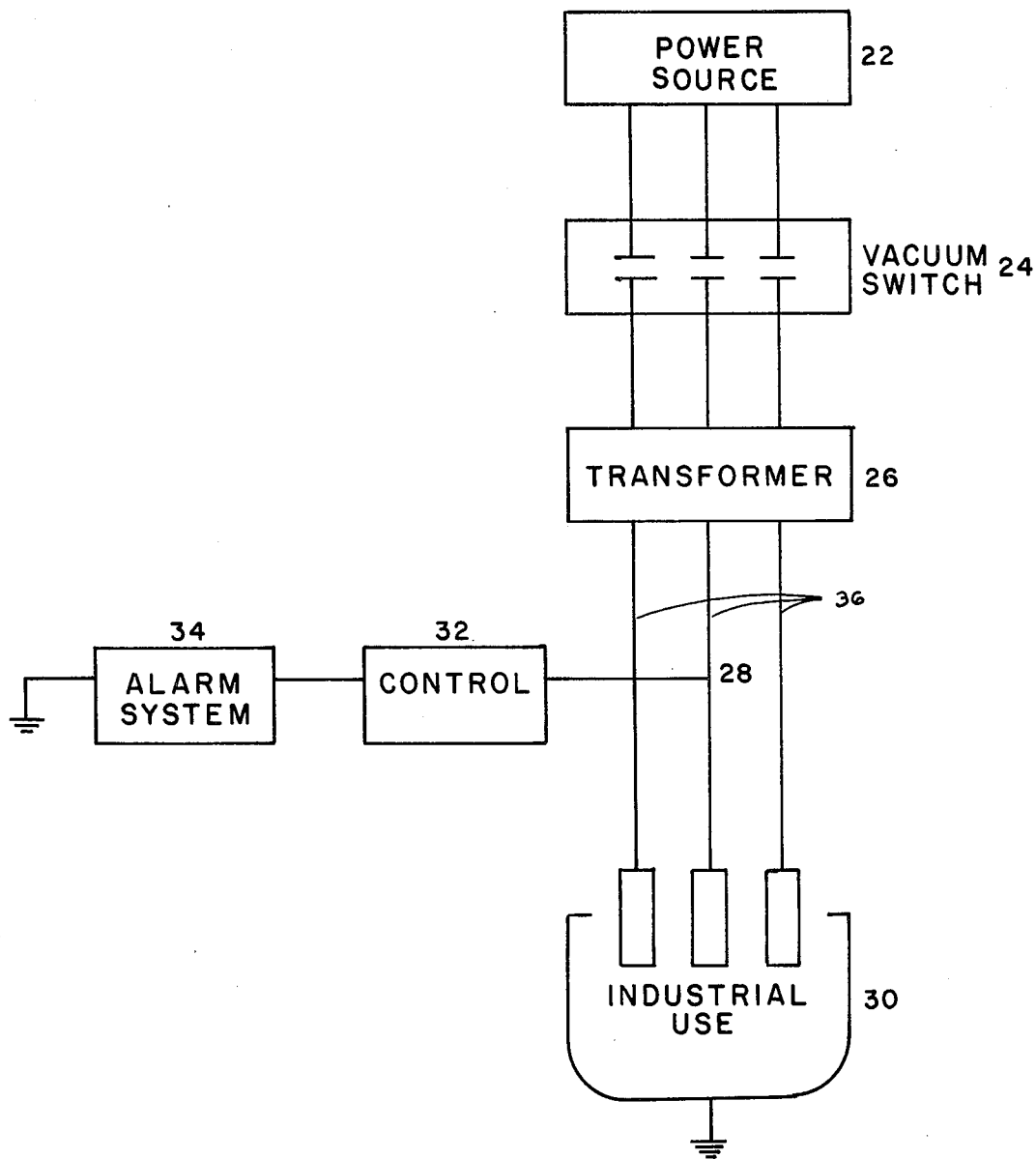
FIG. 2 is a schematic diagram of the position of the alarm system in relation to the vacuum switch and the industrial use.

The schematic of FIG. 2 sets forth the location of the common point 28 between the vacuum switch 24 and the industrial use 30, thereby allowing any surge of electrical energy past the vacuum switch 24 towards the industrial use 30 to be felt at the common point 28 and thus relayed to the alarm system 34. The common point 28 may be placed on any one of the three electrical power lines 36, or three common points may be placed on each of the three power lines 36. In each of the above listed configurations involving the common point 28, sufficient voltage will be felt across the alarm system 34 to activate the alarm in case of malfunction.

Figure 3:
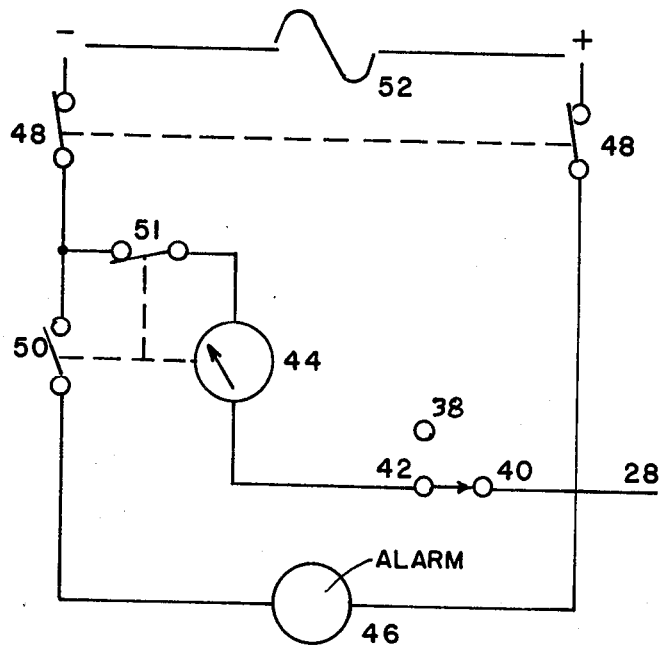
FIG. 3 is a schematic circuit diagram showing the major elements of the system.
Figure 4:
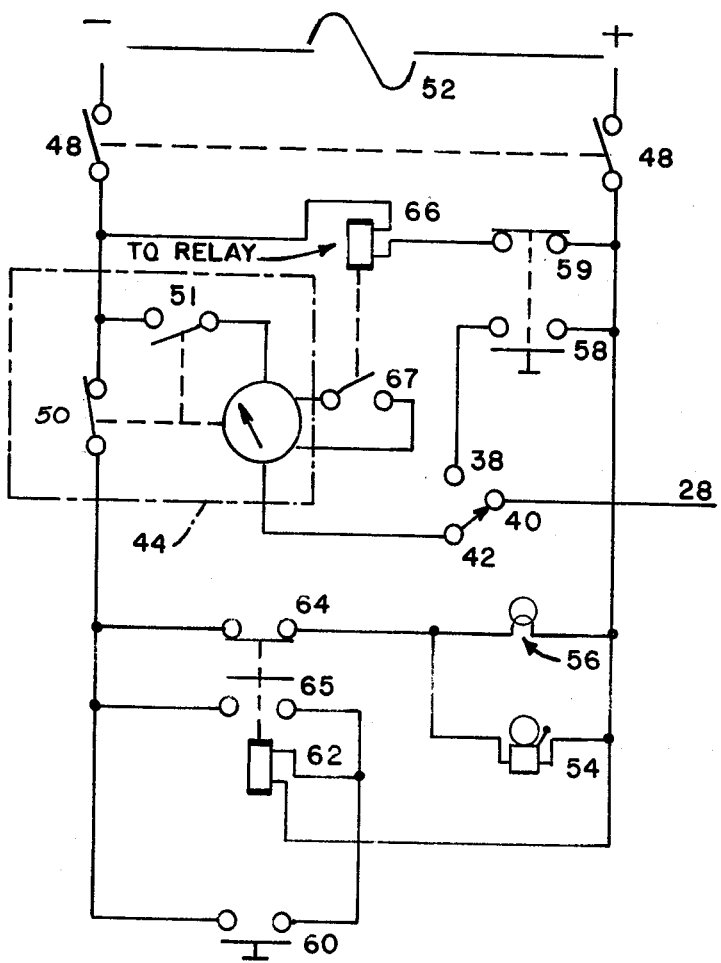
FIG. 4 is a circuit diagram of the system with additions beyond the basic circuit.

FIGS. 3 and 4 show in more detail the circuitry that activates the warning system in the event of a malfunction.

In relating the alarm system 34 and the control 32 of FIGS. 1 and 2 within the circuitry of FIGS. 3 and 4, the following elements constitute the alarm system; voltage detector relay meter 44, switch 50, switch 51, meter reset timer relay 66, switch 67, relay 62, switches 64 and 65, bell 54, and light 56.

The following elements constitute the control: silence switch 60, switches 58 and 59, and switches 38 and 48.

When the industrial use 30 is either shut down or being worked upon, the vacuum switch 24 is placed in an off position thereby preventing the passage of electrical energy. When the vacuum switch 24 is in the off position, the switch 42, FIG. 3, between the common point 28 and the alarm system 34 is manually placed in the connecting position 40, thereby allowing electrical energy to flow to the alarm system 34 if current is experienced at the common point 28. Thus, when a malfunction occurs, either across the vacuum switch 24 or due to a mechanical malfunction, current experienced at the common point 28, will be experienced at the voltage detector relay meter 44.

In the preferred embodiment a Simpson voltage detection meter is utilized. The Simpson Co. is located at 853 Dundee Ave., Elgin, Illinois. The specific Simpson voltage detection meter relay utilized is found under Simpson publication specification 55-100001 revision number 9 published June of 1975.

When the industrial use 22 is being used, the switch 42 is placed in the closed position 38, thereby preventing current to flow through to the voltage detector relay meter 44.

When the industrial equipment 30 is in use, the switches 48 are in an open position preventing common voltage 52 from being applied to the control panel 32 and alarm system 34 circuits. When the industrial use 30 is not being used and the vacuum switch 24 is open, the switches 48 are closed allowing common voltage 52 to be potentially applied to the control panel 32 and alarm system 34 circuits. The common voltage 52 is prevented from reaching the alarm circuit 46 when there is not a malfunction, for switch 50 is in an open position and switch 51 is in a closed position.

If and when a malfunction occurs when the vacuum switch 34 is off, current is felt at the common point 28. Since the switch 42 is placed in the closed position 40, current continues to the voltage detector relay meter 44. Switch 42 is operated manually. Since switch 51 is in a closed position, the malfunction current flows through the voltage detector relay meter 44. The voltage detector relay meter 44 is set at a pre-selected minimum so that if a voltage is detected greater than the minimum set on the voltage detector meter 44, switch 50 is closed and switch 51 is opened.

In FIG. 3 the switch 51 is in a closed position and switch 50 is in an open position. Thus, FIG. 3 illustrates the condition where the vacuum switch 24 is in an open position and there should be no current felt at the common point 28. In this circumstance, the common voltage 52 is connected to the alarm system 34 and control system 32 by the switches 48. It should also be pointed out that in FIG. 3, no malfunction current has been experienced at the voltage detector meter relay 44 to cause the closing of switch 50.

Upon experiencing malfunction current of sufficient magnitude, voltage detector meter relay 44 closes switch 50 thereby allowing common voltage 52 to activate the alarm circuits 46. The voltage experienced at common point 28 during the malfunction necessary to activate the alarm circuit 46 is variable and is easily modified by determining a set point on the voltage detector relay meter 44.

In FIG. 4 the voltage detector meter relay 44, malfunction current greater than a pre-selected minimum has been experienced by the voltage detector meter relay 44. Having experienced the malfunction current, the voltage detector meter relay has caused switch 51 to open and switch 50 to close. Thus, common voltage 52 is experienced by the alarm circuit 46.

The alarm circuit 46 may be composed of both audio and visual warning elements, represented in the circuit of FIG. 4 as a bell 54 and light 56.

In addition to the basic alarm circuitry described above, there is a test alarm feature of the circuit as shown in FIG. 4. The testing of the alarm circuit is accomplished when the vacuum switch 24 is in the closed position allowing voltage to be applied to the industrial use 30, thus the switch 42 is in the open position 38. To test, the switch 58 is closed and switch 59 is opened allowing common voltage 52 to reach the voltage detector meter relay 44. The current from the power supply 52 reaching voltge detector meter relay 44 is necessarily sufficient to close switch 50 thereby allowing common voltage 52 to the alarm circuit 46.

The circuit of FIG. 4 also allows for the alarm system to be silenced. When the warning is on, current flows to the bell 54 and light 56. To silence the alarm, silence switch 60 is closed, thereby energizing control relay 62 which opens switch 64 and closes switch 65 thereby locking up the relay 62. The opening of switch 64 interrupts current to the light 56 and bell 54, thus silencing the alarms after the hazards have been detected and maintenance is in progress.

After the malfunction has been corrected, switches 48 are opened thereby cutting off the common voltage 52 from the alarm 46. Once common voltage 52 is no longer experienced across meter reset timer relay 66, after a given period of time meter reset timer relay 66 closes switch 67 which in turn closes switch 51 and opens switch 50.

In the preferred embodiment, the meter reset timer relay 66 is a part of the Simpson voltage detection meter relay described previously. The specific Simpson voltage detection meter relay utilized is found under Simpson publication specification 55-100001 revision number 9 published June of 1975.

Thus, the closing of switch 51 and opening of switch 50 is done internally within the voltage detection meter relay 44. The advantage of the meter reset timer relay 66 is that the voltage detection meter 44 is always in a condition for detection of current and there is no reliance on manually setting the voltage detection meter relay 44 for detection.

The illustrated embodiment can be varied within the scope of the invention. Thus, it is possible, for example to vary the warning devices and vary the circuit which actuates the warning devices. The important feature of the invention is that the warning devices are not actuated directly by the voltage produced from the malfunction itself.

Although, a particular preferred embodiment of the invention has been disclosed above for illustrative purposes, it will be understood that variations of modifications thereof which lie within the scope of the appended claims are contemplated.

The embodiments of the inventions in which an exclusive property or privilege is claimed are defined as follows:

1. An electrical malfunction alarm circuit for detecting a malfunction in an electrical power circuit that supplies electrical power to an industrial arc furnace, the electrical power circuit including a power source connected to a vaccum-operated switch which in turn connects to the primary of a transformer, which transformer, in turn, is connected through a plurality of conductors to the arc furnace, the electrical malfunction alarm circuit adapted to detect the presence of electrical power at the arc furnace when the vacuum-operated switch is in an open condition, said electrical malfunction circuit comprising:

a voltage detection meter relay serially connected on one side thereof through a first control switch to one side of a power supply and serially connected on the other side thereof through a second control switch to one of the conductors extending between the transformer and the arc furnace;

a third control switch serially connected between said one side of said power supply and one side of an alarm circuit, the other side of said alarm circuit connected to said other side of said power supply;

said voltage detection meter relay adapted, when the voltage across said meter relay is below a predetermined set value, to place the first and third switches in their closed and opened positions, respectively, and when said voltage across said meter relay is above the predetermined set value, to open said first switch and close said second switch to supply electrical power to said alarm circuit;

said alarm circuit including a visual alarm device and an audio alarm device connected in parallel with each other and between said other side of said power supply and first normally closed relay-controlled switch contacts connected to said one side of said power supply, a relay coil magnetically coupled to said first normally closed relay controlled switch contacts, said relay coil serially connected with a silence switch between said one side and said other side of said power supply, first normally open relay controlled switch contacts connected in parallel with said silence switch whereby operation of said silence switch causes said relay coil to open said normally closed relay switch contacts to interrupt the alarm device circuit and close said normally open relay-controlled switch contacts to latch said normally open relay controlled switch contacts in the closed position;

a test circuit including a test switch having normally open contacts connected between said other side of said power supply and said voltage detector meter relay, so that when said test switch is closed, electrical power is supplied to said voltage detector relay to cause it to open said first switch and close said second switch to actuate said alarm circuit; and a time delay relay mechanically connected to a reset switch connected to said voltage detector meter relay, said time delay relay having a relay coil serially connected from said one side of said power supply through a set of normally closed switch contacts of said test switch to the other side of said power supply, said normally closed switch contacts, when opened in response to actuation of said test switch, causing said time delay relay to reset said voltage detector meter relay.

* * * * *